(12) United States Patent
Anderl et al.

(10) Patent No.: US 11,326,621 B2
(45) Date of Patent: May 10, 2022

(54) IMPLEMENTING ELECTRONIC ENCLOSURE COOLING CONTAINMENT FOR CONCURRENT MAINTENANCE ACTIONS

(71) Applicant: International Business Machines Corporation, Armonk, NY (US)

(72) Inventors: William James Anderl, Rochester, MN (US); Phillip V. Mann, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 315 days.

(21) Appl. No.: 16/125,590

(22) Filed: Sep. 7, 2018

(65) Prior Publication Data
US 2020/0080570 A1    Mar. 12, 2020

(51) Int. Cl.
*H05K 7/20* (2006.01)
*F04D 29/56* (2006.01)
*G06F 1/18* (2006.01)
*G06F 1/20* (2006.01)

(52) U.S. Cl.
CPC .......... *F04D 29/563* (2013.01); *G06F 1/181* (2013.01); *G06F 1/20* (2013.01); *H05K 7/20009* (2013.01); *G06F 2200/201* (2013.01)

(58) Field of Classification Search
CPC ... F04D 29/563; H05K 7/20009; G06F 1/181; G06F 1/20; G06F 2200/201
USPC ........................................................ 454/184
See application file for complete search history.

(56) References Cited

U.S. PATENT DOCUMENTS

| | | | |
|---|---|---|---|
| 5,432,674 A | 7/1995 | Hardt | |
| 5,813,243 A | 9/1998 | Johnson et al. | |
| 7,545,641 B2* | 6/2009 | Chen | H05K 7/20727 361/679.48 |
| 7,957,133 B2 | 6/2011 | Zieman et al. | |
| 9,521,778 B2 | 12/2016 | Lin et al. | |
| 9,696,769 B1 | 7/2017 | Hamilton et al. | |
| 10,588,241 B2* | 3/2020 | Goergen | G05D 7/0676 |
| 2002/0141879 A1* | 10/2002 | Winkel | F04D 29/602 417/214 |

FOREIGN PATENT DOCUMENTS

WO    WO2014032573 A1    6/2014

OTHER PUBLICATIONS

"Thermal Management in CPI Cabinet Systems", Chatsworth Products, Inc., pp. 1-10, 2004 http://www.synginc.com/docs/thermal_management_wp.pdf.

* cited by examiner

*Primary Examiner* — Avinash A Savani
*Assistant Examiner* — Dana K Tighe
(74) *Attorney, Agent, or Firm* — Nathan M. Rau

(57) ABSTRACT

Methods and structures are provided for implementing electronic enclosure cooling containment for concurrent maintenance actions with a top cover of the electronic enclosure removed. The structure includes a moveable airflow baffle being attached to the associated electronic enclosure. During concurrent maintenance actions, the moveable airflow baffle is moved to an open position over at least a partial length of a replaceable component, without being detached or removed from the associated electronic enclosure. During normal operations, the moveable airflow baffle hangs down over at least a partial length of a replaceable component.

20 Claims, 5 Drawing Sheets

IMPLEMENTING ELECTRONIC ENCLOSURE COOLING CONTAINMENT FOR CONCURRENT MAINTENANCE ACTIONS

FIELD OF THE INVENTION

The present disclosure relates generally to the data processing field, and more particularly, relates to methods and structures for implementing electronic enclosure cooling containment for concurrent maintenance actions.

BACKGROUND

Cooling can no longer be indefinitely provided for high powered Peripheral Component Interconnect Express (PCI-Express or PCIe) adapters during customer concurrence maintenance actions. During customer concurrence maintenance action the top cover of the system is removed for an undetermined long time.

Majority of industry do not allow concurrence maintenance in PCIe adapters. System maintenance generally requires a system shut down, and concurrently maintainable systems may require time limits, such as less than 5 minutes. Also additional baffling is incorporated into the existing system.

SUMMARY

Principal aspects of the present disclosure are to provide methods and structures for implementing electronic enclosure cooling containment for concurrent maintenance actions with a top cover of the electronic enclosure removed. Other important aspects of the present disclosure are to provide such methods and structures substantially without negative effects and that overcome many of the disadvantages of prior art arrangements.

In brief, methods and structures are provided for implementing electronic enclosure cooling containment for concurrent maintenance actions with a top cover of the electronic enclosure removed. The structure includes a moveable airflow baffle being attached to the associated electronic enclosure. During concurrent maintenance actions, the moveable airflow baffle is moved to an open position over at least a partial length of a replaceable component, without being detached or removed from the associated electronic enclosure. During normal operations, the moveable airflow baffle hangs down over at least a partial length of a replaceable component.

In accordance with features of the disclosure, the moveable airflow baffle can be affixed or attached to a chassis, a chassis bulkhead, or an existing airflow baffle within the electronic enclosure. The moveable airflow baffle optionally includes a finger loop at a free end used to assist with opening and holding open the moveable airflow baffle.

In accordance with an embodiment of the disclosure, during normal operations, the moveable airflow baffle hangs down over at least a partial length of a PCIe or other replaceable components, such as memory.

In accordance with an embodiment of the disclosure, the moveable airflow baffle replaces a system baffle.

In accordance with features of the disclosure, the free end of the moveable airflow baffle optionally is free floating during normal operations. The free end of the moveable airflow baffle optionally includes a latch or magnet catch operable during normal operations.

In accordance with features of the disclosure, optionally the free end of the moveable airflow baffle is held open when moved to the open position. In the open position, the moveable airflow baffle prevents a cover, or a separate portion of the cover, of the associated electronic enclosure from being installed. The cover of the associated electronic enclosure is installed with the free end of the moveable airflow baffle moved or allowed to return to its position over the at least partial length of the replaceable component for normal operations.

In accordance with features of the disclosure, the moveable airflow baffle is formed of a selected material, such as plastic, rubber, or other flexible material, having sufficient rigidity and strength to prevent a cover of the associated electronic enclosure from being installed when the moveable airflow baffle is in the open position. The selected material has sufficient elasticity to allow it to bend to its open position and optionally return on its own or spring back to its position for normal operation if not manually held in its open position.

BRIEF DESCRIPTION OF THE DRAWINGS

The present disclosure together with the above and other objects and advantages may best be understood from the following detailed description of the preferred embodiments of the disclosure illustrated in the drawings, wherein.

DETAILED DESCRIPTION OF THE PREFERRED EMBODIMENTS

In the following detailed description of embodiments of the disclosure, reference is made to the accompanying drawings, which illustrate example embodiments by which the disclosure may be practiced. It is to be understood that other embodiments may be utilized and structural changes may be made without departing from the scope of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the disclosure, methods and structures are provided for implementing electronic enclosure cooling containment for concurrent maintenance actions with a top cover of the electronic enclosure removed. The structure includes a moveable airflow baffle being attached to the associated electronic enclosure. During concurrent maintenance actions, the moveable airflow baffle is moved to an open position over at least a partial length of a replaceable component, without being detached or removed from the associated electronic enclosure. In the open position, the moveable airflow baffle prevents the top cover of the associated electronic enclosure from being installed. The moveable airflow baffle is formed of a selected flexible material, having sufficient rigidity and strength to prevent the cover of the associated electronic enclosure from being installed when the moveable airflow baffle is in the open position. The selected material has sufficient elasticity to allow it to bend to its open position and optionally return on its own or spring back to its position for normal operation if not manually held in its open position.

In accordance with features of the disclosure, the moveable airflow baffle optionally replaces a system baffle.

Figure 1:
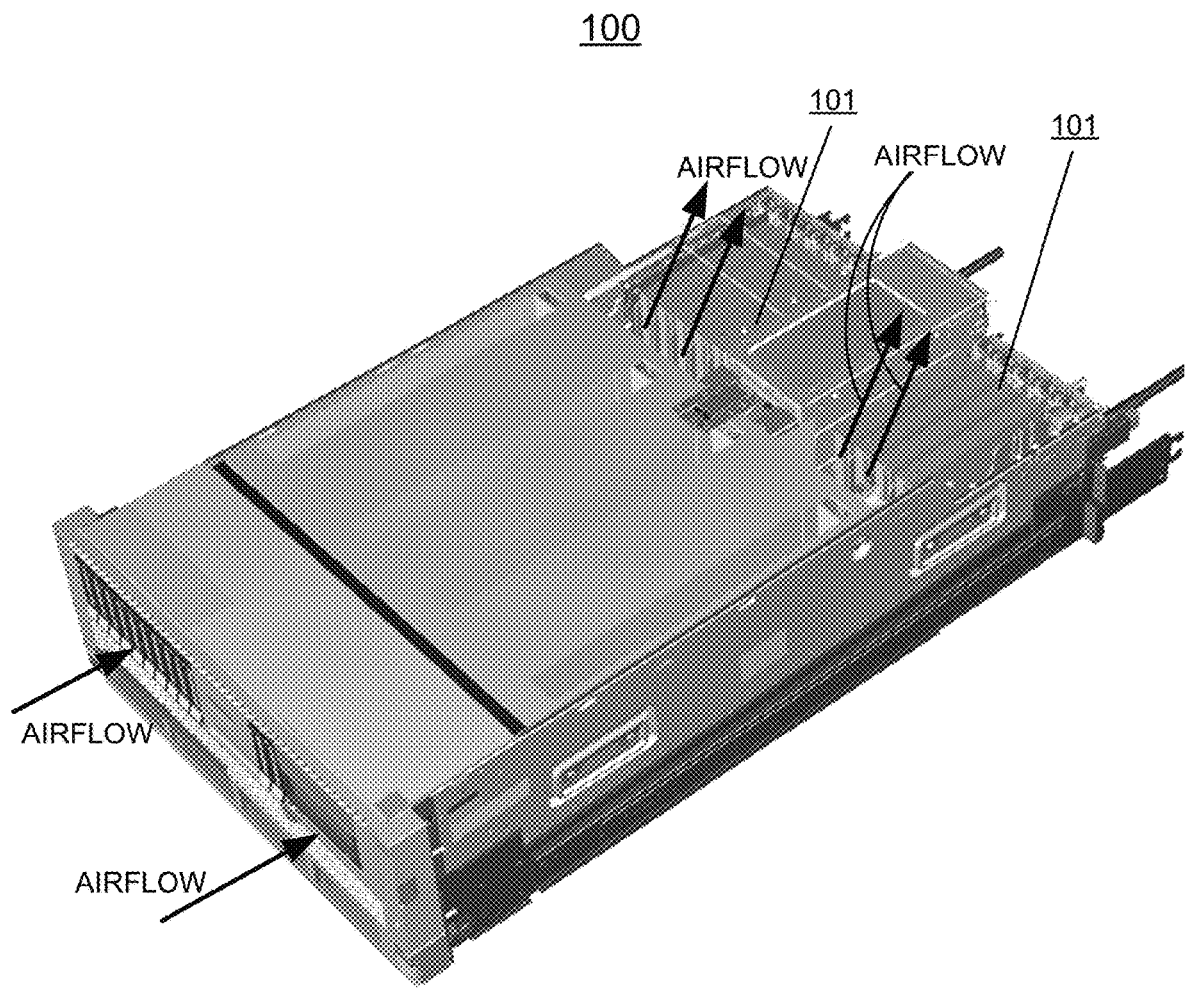
FIG. 1 is a perspective view not to scale schematically illustrating an example enclosure for implementing electronic enclosure cooling containment for concurrent maintenance actions with a top cover of the electronic enclosure removed in accordance with an illustrative embodiment.

Referring now to FIG. 1, there is shown a perspective view not to scale schematically illustrating an example enclosure generally designated by the reference character 100 for implementing electronic enclosure cooling containment for concurrent maintenance actions with a top cover of the electronic enclosure removed in accordance with an illustrative embodiment. As shown, enclosure 100 includes tandem areas 101 of the example system enclosure 100 arranged for concurrent maintenance actions. As shown, airflow enters at a front of the associated electronic enclosure 100 as indicated by arrows labeled AIRFLOW and exits at a front portion of the tandem areas 101 without reaching a rear or back of the associated electronic enclosure 100.

Figure 2:
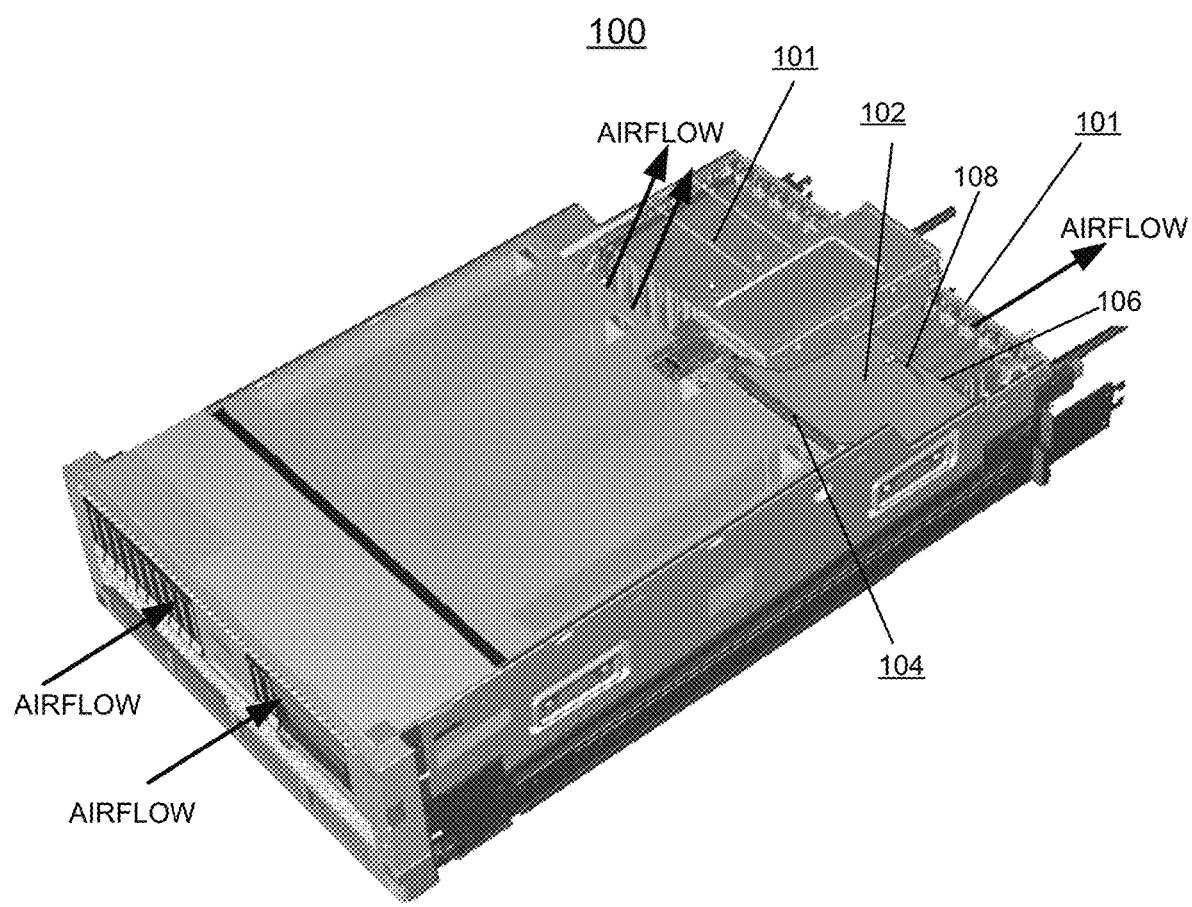
FIG. 2 is a perspective view not to scale schematically illustrating an example structure for implementing electronic enclosure cooling containment for concurrent maintenance actions with a top cover of the electronic enclosure removed in accordance with an illustrative embodiment.

Referring also to FIGS. 2-5, system enclosure 100 optionally includes high powered PCI-Express (PCIe) adapters including one or more moveable airflow baffles 102 provided in one or more areas 101, such as hanging over at least a partial length of PCI, PCI dividers or other replaceable components such as memory. As shown, airflow enters at the front of the associated electronic enclosure 100 indicated by arrows labeled AIRFLOW and exits at the rear or back of the associated electronic enclosure 100 with the moveable airflow baffle 102 in the area 101. In FIG. 2, in the area 101 not including a moveable airflow baffle 102, the airflow exits at a front portion of the tandem areas 101 without reaching a rear or back of the associated electronic enclosure 100.

In accordance with features of the disclosure, the moveable airflow baffle 102 provides electronic enclosure cooling containment to keep airflow in the system 100 longer when the top cover is removed. The moveable airflow baffle optionally replaces a system baffle of the associated electronic enclosure 100. During normal operations, the moveable airflow baffle 102 hangs down over at least a partial length of a replaceable component.

Figure 3:
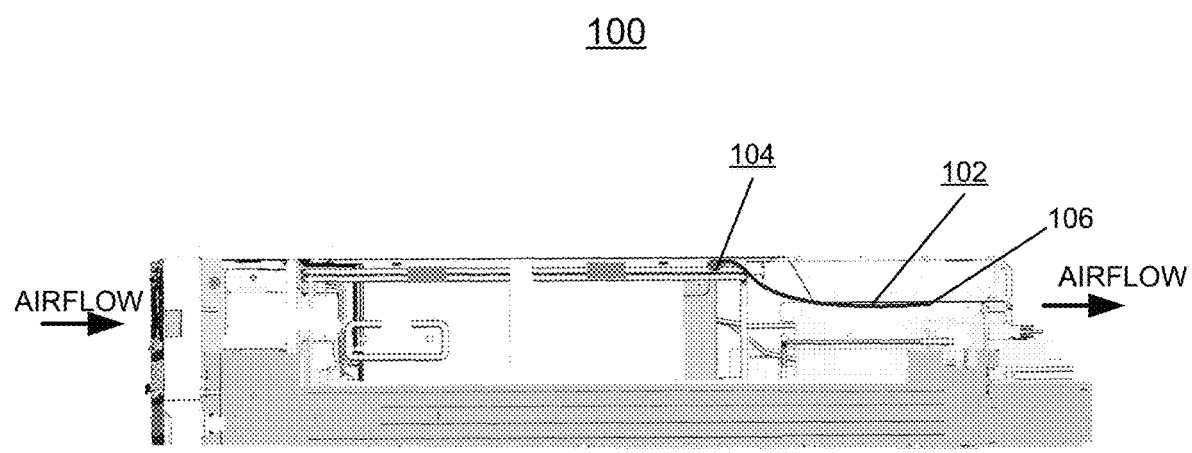
FIG. 3 is a side view not to scale schematically illustrating example features of the example moveable airflow baffle in a normal position in accordance with an illustrative embodiment.

Referring now to FIGS. 2 and 3, there is shown an example structure comprising a moveable airflow baffle generally designated by the reference character 102 for implementing electronic enclosure cooling containment for concurrent maintenance actions in accordance with an illustrative embodiment. The moveable airflow baffle 102 is attached to the associated electronic enclosure 100. The moveable airflow baffle 102 is hinged or fixedly attached at a fixed end 104 to one of a chassis, a chassis bulkhead, and a system airflow baffle of the associated electronic enclosure. The moveable airflow baffle 102 is arranged as a permanent feature that is not removed.

In FIGS. 2 and 3, example features of the moveable airflow baffle 102 include that in a normal position in accordance with an illustrative embodiment a free end 106 of the moveable airflow baffle 102 is free floating, hanging down over at least a partial length of a replaceable component in area 101. Optionally the free end 106 of the moveable airflow baffle includes a latch or magnet catch. Airflow enters the front end of the associated electronic enclosure 100 as indicated by arrows labeled AIRFLOW toward and proximate to the free end 106 of the moveable airflow baffle 102. During normal operation, the free end 106 of the moveable airflow baffle 102 rests between the top of the replaceable components and the enclosure's top cover, without obstructing airflow or mechanical movement of the top cover. During concurrent maintenance, with the cover off, the free end 106 of the moveable airflow baffle 102 will not blow open.

In accordance with features of the disclosure, the moveable airflow baffle 102 is formed of a selected material, such as plastic, rubber, or other flexible material. The moveable airflow baffle 102 has sufficient rigidity and strength to prevent a cover of the associated electronic enclosure 100 from being installed when the moveable airflow baffle is in the open position. The free end 106 of the moveable airflow baffle 102 is angled downwardly, hangs down over a partial length of the PCI, or other replaceable component and can be in contact with the a lid or rest on the top of a PCI or PCI dividers, or special guide ledges.

Figure 4:
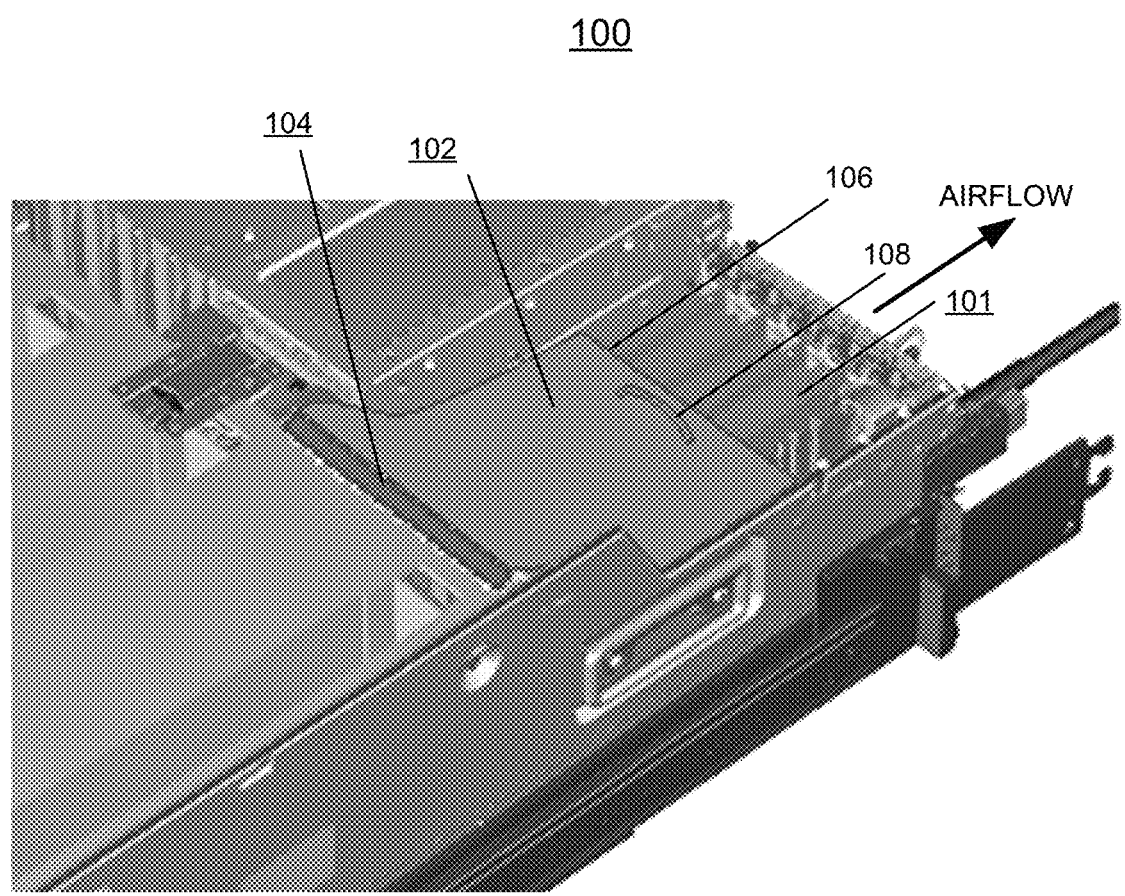
FIGS. 4, and 5 are respective detailed views illustrating the moveable airflow baffle in a normal position in FIG. 4 and in an open position in FIG. 5 for concurrent maintenance actions in accordance with an illustrative embodiment.
Figure 5:
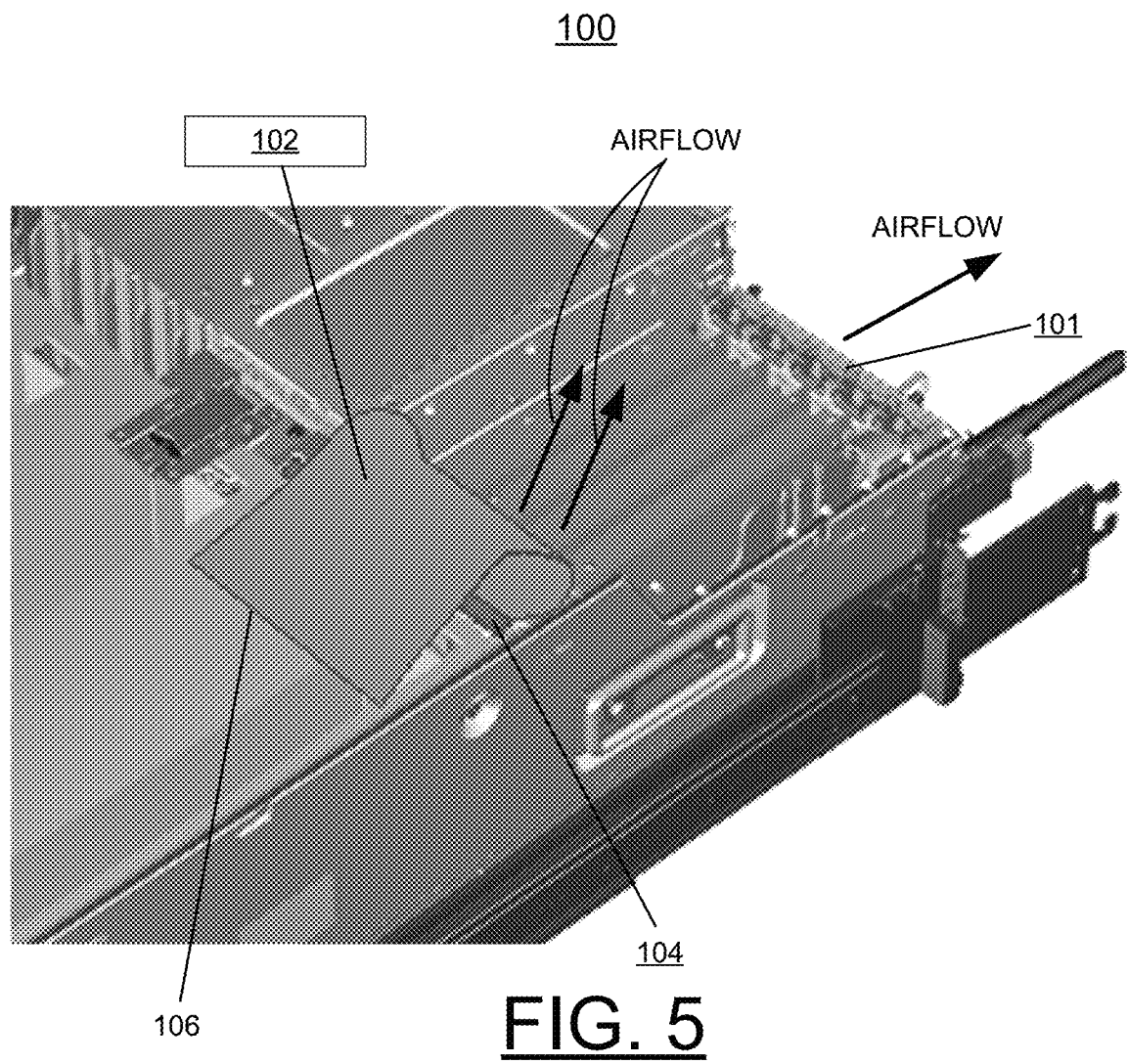

FIGS. 4, and 5 are respective detailed views illustrating the moveable airflow baffle 102 in a normal position in FIG. 4, and move to an open position in FIG. 5 for concurrent maintenance actions in accordance with an illustrative embodiment.

As illustrated in FIG. 4, during normal operation, the moveable airflow baffle 102 is attached at fixed end 104 extending over at least a partial length of a replaceable component and the free end 106 and is free floating at the free end 106. Airflow is indicated by arrow labeled AIRFLOW toward and proximate to the free end 106 of the moveable airflow baffle 102. During normal operation, the free end 106 of the moveable airflow baffle 102 remains hanging downward on the replaceable component, and does not blow open.

In accordance with features of the disclosure, the moveable airflow baffle 102 optionally includes a finger loop 108 near a free end 106 that is used to assist moving the moveable airflow baffle.

It should be understood that the moveable airflow baffle 102 is not limited to features of the illustrated disclosure. For example, a latch or some retention feature could be incorporated near the free floating end 106 of the moveable airflow baffle 102.

As illustrated in FIG. 5, during concurrent maintenance actions, the moveable airflow baffle 102 is moved to an open position over at least a partial length of a replaceable component 101, without being detached or moved from the associated electronic enclosure 100. Optionally the free end 106 of the moveable airflow baffle 102 is held open when moved to the open position. In the open position, some airflow exits the intended region when the airflow baffle 102 is held in the maintenance position. When the airflow baffle 102 is let go, it returns to the operational position and typical airflow resumes, as shown in FIG. 4. In the open position, the moveable airflow baffle 102 prevents a cover of the associated electronic enclosure from being installed. The cover of the associated electronic enclosure 100 is installed with the free end 106 of the moveable airflow baffle 102 moved back or allowed to return to its position over the partial length of the replaceable component for normal operations.

In accordance with features of the disclosure, the moveable airflow baffle 102 is formed of a selected material, such as plastic, rubber, or other flexible material having sufficient rigidity and strength to prevent a cover of the associated electronic enclosure from being installed when the moveable airflow baffle is in the open position. The selected material has sufficient elasticity to allow it to bend to its open position and optionally return on its own or spring back to its position for normal operation if not manually held in its open position.

While the present disclosure has been described with reference to the details of the embodiments of the disclosure shown in the drawing, these details are not intended to limit the scope of the disclosure as claimed in the appended claims.

What is claimed is:

1. A structure for implementing electronic enclosure cooling containment for concurrent maintenance actions with a top cover of an associated electronic enclosure removed comprising:
a moveable airflow baffle being attached to the associated electronic enclosure;
the moveable airflow baffle being moved to an open position over at least a partial length of a replaceable component for the concurrent maintenance actions, without being detached or removed from the associated electronic enclosure; and
during normal operations, the moveable airflow baffle hangs down over at least a partial length of the replaceable component, and is contacted by at least a portion of airflow flowing through the associated electronic enclosure wherein the airflow contacts only a bottom portion of the moveable airflow baffle.

2. The structure as recited in claim 1, wherein the moveable airflow baffle maintains typical airflow in the associated electronic enclosure for a period of time after the top cover is removed.

3. The structure as recited in claim 1, wherein the moveable airflow baffle being attached to the associated electronic enclosure includes the moveable airflow baffle attached to one of a chassis, a chassis bulkhead, and a system airflow baffle.

4. The structure as recited in claim 1, wherein the moveable airflow baffle includes a selected one of a hinged attachment and a fixed attachment to the associated electronic enclosure.

5. The structure as recited in claim 1, includes a free end of the moveable airflow baffle free floating during normal operations.

6. The structure as recited in claim 1, includes a free end of the moveable airflow baffle held open when moved to the open position, and the free end of the moveable airflow baffle returning to its hanging position for the normal operations when the moveable airflow baffle is not held open.

7. The structure as recited in claim 1, wherein the moveable airflow baffle prevents the top cover of the associated electronic enclosure from being installed in the open position.

8. The structure as recited in claim 1, wherein the moveable airflow baffle includes a selected one of a plastic moveable airflow baffle, and rubber moveable airflow baffle.

9. The structure as recited in claim 1, wherein the moveable airflow baffle is formed of a flexible material having sufficient rigidity and strength to prevent the top cover of the associated electronic enclosure from being installed when the moveable airflow baffle is in the open position.

10. The structure as recited in claim 1, wherein the moveable airflow baffle includes a finger loop at a free end used to assist moving the moveable airflow baffle.

11. A method for implementing electronic enclosure cooling containment for concurrent maintenance actions with a top cover of an associated electronic enclosure removed comprising:
providing a moveable airflow baffle being attached to the associated electronic enclosure;
moving the moveable airflow baffle to an open position over at least a partial length of a replaceable component for the concurrent maintenance actions, without being detached or removed from the associated electronic enclosure; and
during normal operations, providing the moveable airflow baffle to hang down over at least a partial length of the replaceable component, such that the moveable airflow baffle is contacted by at least a portion of airflow flowing through the associated electronic enclosure wherein the airflow contacts only a bottom portion of the moveable airflow baffle, and wherein the movable airflow baffle is disposed downstream from a source of the airflow.

12. The method as recited in claim 11, includes providing a finger loop at a free end used to move the moveable airflow baffle.

13. The method as recited in claim 11, wherein providing the moveable airflow baffle includes providing a selected one of a hinged attachment and a fixed attachment to the associated electronic enclosure.

14. The method as recited in claim 11, wherein providing the moveable airflow baffle includes preventing the top cover of the associated electronic enclosure from being installed with the moveable airflow baffle in the open position.

15. The method as recited in claim 11, wherein providing the moveable airflow baffle includes providing a selected one of a plastic moveable airflow baffle, and rubber moveable airflow baffle.

16. The method as recited in claim 11, wherein providing the moveable airflow baffle includes forming the moveable airflow baffle of a flexible material having sufficient rigidity and strength to prevent the top cover of the associated electronic enclosure from being installed when the moveable airflow baffle is in the open position.

17. The method as recited in claim 11, wherein providing the moveable airflow baffle includes providing the moveable airflow baffle to maintain typical airflow in the electronic enclosure for a period of time after the top cover is removed.

18. The method as recited in claim 11, wherein providing the moveable airflow baffle includes a free end of the moveable airflow baffle free floating during the normal operations.

19. The method as recited in claim 11, wherein providing the moveable airflow baffle includes providing a free end of the moveable airflow baffle held open when moved to the open position.

20. The method as recited in claim 11, wherein providing the moveable airflow baffle includes providing a free end of the moveable airflow baffle returning to its hanging position for the normal operations when the moveable airflow baffle is not held open.

* * * * *